(12) United States Patent
Barden

(10) Patent No.: US 12,584,954 B2
(45) Date of Patent: Mar. 24, 2026

(54) DIAGNOSTIC PROBE APPARATUS AND RELATED SYSTEMS AND METHODS

(71) Applicant: Power Probe Group, Inc., Charlotte, NC (US)

(72) Inventor: David Douglas Barden, Crestline, CA (US)

(73) Assignee: POWER PROBE GROUP, INC., Charlotte, NC (US)

( * ) Notice: Subject to any disclaimer, the term of this patent is extended or adjusted under 35 U.S.C. 154(b) by 0 days.

(21) Appl. No.: 18/555,607

(22) PCT Filed: Apr. 10, 2023

(86) PCT No.: PCT/US2023/065577
§ 371 (c)(1),
(2) Date: Oct. 16, 2023

(87) PCT Pub. No.: WO2024/158435
PCT Pub. Date: Aug. 2, 2024

(65) Prior Publication Data
US 2025/0341562 A1     Nov. 6, 2025

Related U.S. Application Data

(60) Provisional application No. 63/481,445, filed on Jan. 25, 2023.

(51) Int. Cl.
*G01R 31/00*      (2006.01)
*G01R 1/067*      (2006.01)
*G01R 31/28*      (2006.01)

(52) U.S. Cl.
CPC ..... *G01R 31/2839* (2013.01); *G01R 1/06766* (2013.01); *G01R 31/2837* (2013.01)

(58) Field of Classification Search
CPC ...... G01R 1/04; G01R 1/067; G01R 1/06788; G01R 15/125; G01R 15/186;
(Continued)

(56) References Cited

U.S. PATENT DOCUMENTS 11,346,858 B1 *   5/2022   Kraft .................... G01R 1/0416
2016/0231354 A1 *  8/2016   Rayman ............. G01R 31/2896
(Continued)

OTHER PUBLICATIONS

International Search Report dated Oct. 18, 2023, issued in corresponding International Application No. PCT/US2023/065577, 13 pages.

*Primary Examiner* — Thang X Le
(74) *Attorney, Agent, or Firm* — Shumaker, Loop & Kendrick, LLP; Patrick B. Horne; Lloyd J. Wilson

(57) ABSTRACT

Apparatuses, systems, kits and methods include a diagnostic probe having a first end and a second end opposite the first end and being configured to perform an electrical analysis on the electrical component and provide an output of the electrical analysis. In some instances, an electrical test device configured to energize an electrical component, via a conductive probe element, and perform one or more electric measurements thereon is also included, where the test device includes a housing. Additionally, a conductive probe element configured to be energized by the electrical test device and placed in contact with the electrical component may energize the electrical component when energized by the electrical test device.

13 Claims, 8 Drawing Sheets

(58) Field of Classification Search
CPC ............ G01R 19/0084; G01R 19/2503; G01R
31/006; G01R 31/50; G01R 31/67; G01R
31/6788
See application file for complete search history.

(56) References Cited

U.S. PATENT DOCUMENTS

| | | | |
|---|---|---|---|
| 2019/0072632 A1* | 3/2019 | Huber | G01R 35/00 |
| 2019/0162765 A1* | 5/2019 | Steuer | G01R 19/0023 |
| 2019/0346487 A1* | 11/2019 | Laurino | G01R 15/181 |
| 2020/0284832 A1 | 9/2020 | Barthel | |
| 2021/0263074 A1* | 8/2021 | Rinder | G01R 1/06788 |
| 2021/0405088 A1* | 12/2021 | Pham | G01R 1/067 |

* cited by examiner

101

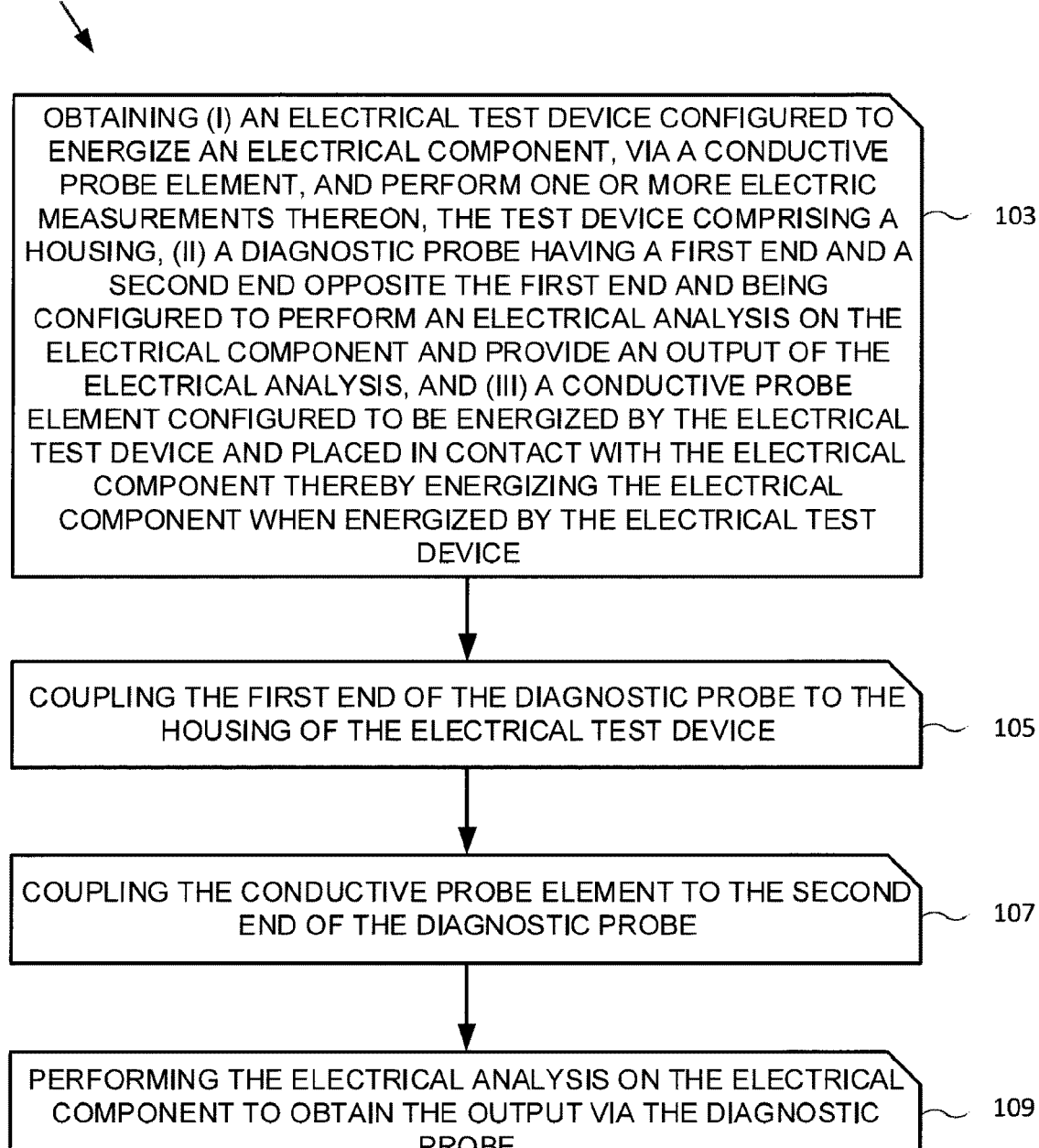

OBTAINING (I) AN ELECTRICAL TEST DEVICE CONFIGURED TO ENERGIZE AN ELECTRICAL COMPONENT, VIA A CONDUCTIVE PROBE ELEMENT, AND PERFORM ONE OR MORE ELECTRIC MEASUREMENTS THEREON, THE TEST DEVICE COMPRISING A HOUSING, (II) A DIAGNOSTIC PROBE HAVING A FIRST END AND A SECOND END OPPOSITE THE FIRST END AND BEING CONFIGURED TO PERFORM AN ELECTRICAL ANALYSIS ON THE ELECTRICAL COMPONENT AND PROVIDE AN OUTPUT OF THE ELECTRICAL ANALYSIS, AND (III) A CONDUCTIVE PROBE ELEMENT CONFIGURED TO BE ENERGIZED BY THE ELECTRICAL TEST DEVICE AND PLACED IN CONTACT WITH THE ELECTRICAL COMPONENT THEREBY ENERGIZING THE ELECTRICAL COMPONENT WHEN ENERGIZED BY THE ELECTRICAL TEST DEVICE — 103

COUPLING THE FIRST END OF THE DIAGNOSTIC PROBE TO THE HOUSING OF THE ELECTRICAL TEST DEVICE — 105

COUPLING THE CONDUCTIVE PROBE ELEMENT TO THE SECOND END OF THE DIAGNOSTIC PROBE — 107

PERFORMING THE ELECTRICAL ANALYSIS ON THE ELECTRICAL COMPONENT TO OBTAIN THE OUTPUT VIA THE DIAGNOSTIC PROBE — 109

FIG. 1

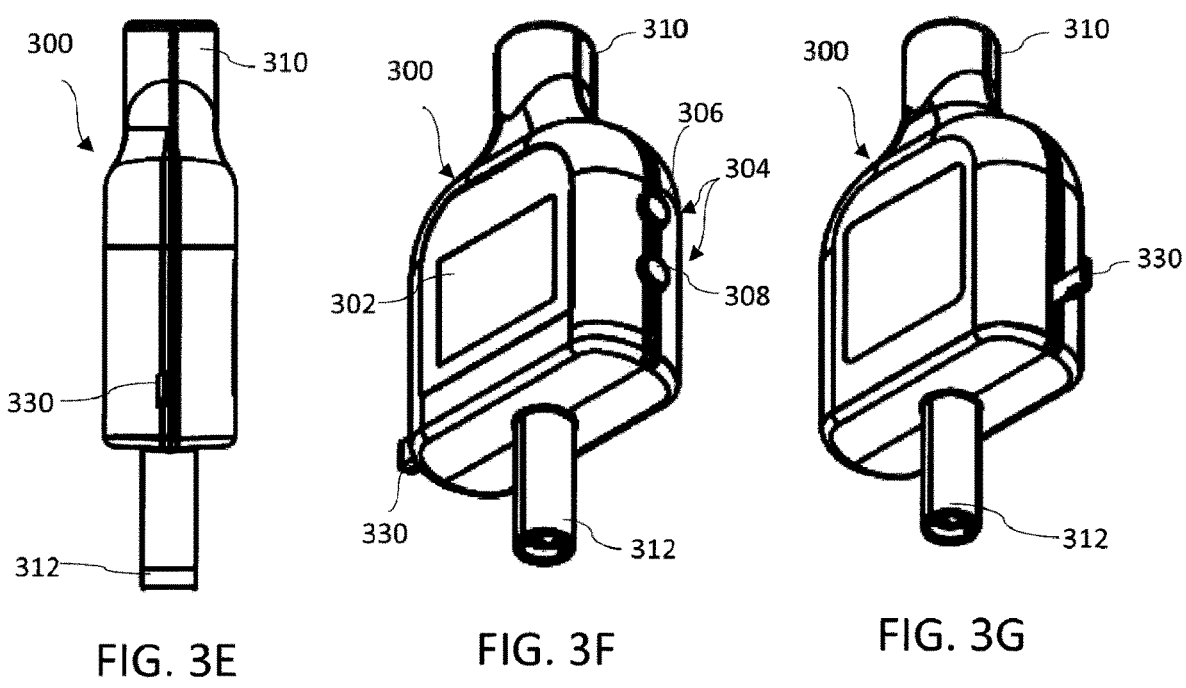
FIG. 3E       FIG. 3F       FIG. 3G
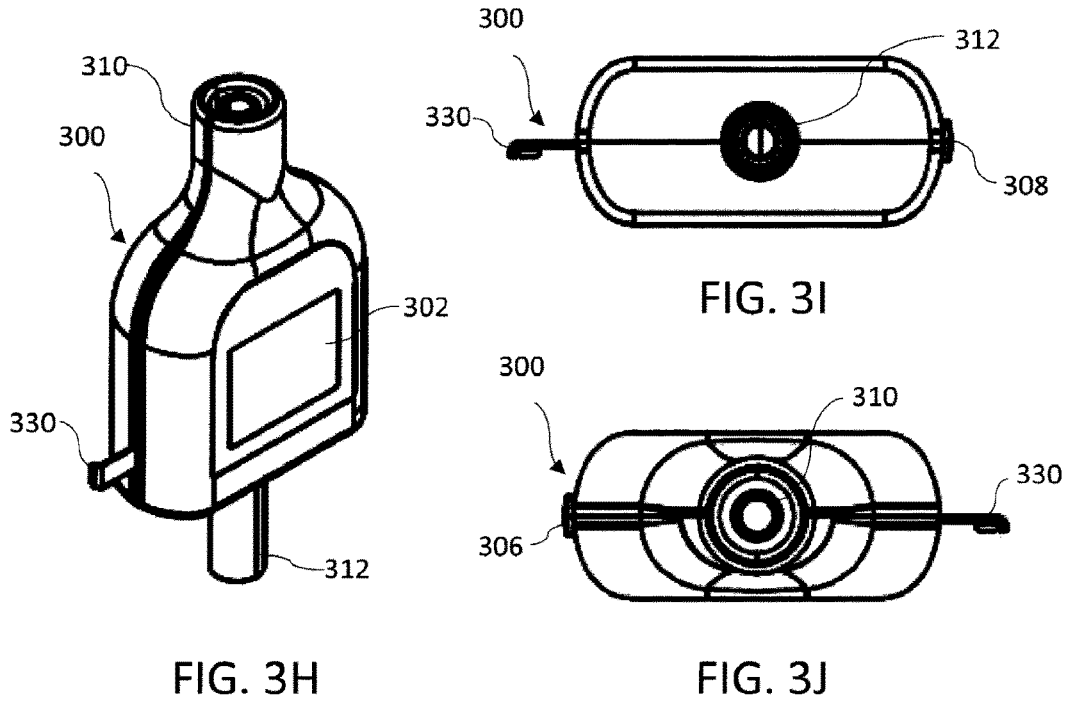
FIG. 3H       FIG. 3J
FIG. 3I

DIAGNOSTIC PROBE APPARATUS AND RELATED SYSTEMS AND METHODS

CROSS-REFERENCE TO RELATED APPLICATIONS

The present application is a United States 371 National Stage Application tracing priority to and claiming the benefit of Patent Cooperation Treaty (PCT) Application No. PCT/US23/65527, filed on Apr. 10, 2023, entitled "DIAGNOSTIC PROBE APPARATUS AND RELATED SYSTEMS AND METHODS", which claims priority benefit of U.S. Provisional Patent Application No. 63/481,445 entitled "DIAGNOSTIC PROBE APPARATUS AND RELATED SYSTEMS AND METHODS" filed on Jan. 25, 2023, and is related to U.S. Design patent application Ser. No. 29/870,324 entitled "DIAGNOSTIC PROBE" filed Jan. 20, 2023, U.S. patent application Ser. No. 17/099,638 entitled "ELECTRICAL TEST DEVICE AND METHOD" filed on Nov. 16, 2020, International Design Registration No. DM/227303, issued on Jan. 24, 2023 entitled "ORNAMENTAL DESIGN OF AN ADAPTOR FOR A DIAGNOSTIC PROBE," U.S. Pat. No. 10,837,994, issued on Nov. 17, 2020 entitled "ELECTRICAL TEST DEVICE AND METHOD," U.S. Pat. No. 9,513,320, issued on Dec. 6, 2016 entitled "ELECTRICAL TEST DEVICE AND METHOD," U.S. Pat. No. 7,184,899, issued on Feb. 27, 2007 entitled "ENERGIZABLE ELECTRICAL TEST DEVICE FOR MEASURING CURRENT AND RESISTANCE OF AN ELECTRICAL CIRCUIT," and U.S. Pat. No. 5,367,250, issued on Nov. 22, 1994 entitled "ELECTRICAL TESTER WITH ELECTRICAL ENERGIZABLE TEST PROBE," the entire contents of each of which are expressly incorporated by reference herein.

FIELD OF THE INVENTION

This invention relates generally to apparatuses, systems, and methods of a diagnostic probe, and more particularly, embodiments of the invention relate to apparatuses, systems, and methods of an electrical diagnostic probe for performing an electrical measurement.

BACKGROUND OF THE INVENTION

Vehicles are often dependent on electronic circuitry for operation, and various apparatuses, systems, and methods exist for diagnosing electrical problems encountered by these vehicles to determine what electrical component may need to be replaced or repaired. Technicians may use electrical test devices to perform this diagnosis. In particular, existing electrical test devices used to measure voltage and continuity may be used by technicians to measure electric potential difference between two points in an electric circuit and to determine if an electrical path can be established between two points. These electrical test devices may be configured, for example, to supply voltage or ground to activate electrical components.

Existing apparatuses, systems, and methods intended to perform this diagnostic process have various shortcomings. For instance, some electrical test devices may have limited functionality. In particular, some electrical test devices may be configured to only detect voltage and continuity, as these measurements are frequent diagnostic measurements in diagnosing electrical conditions. However, there may be times when additional diagnostic testing is needed that is not currently supported by existing electrical test devices.

Therefore, a need exists for improved apparatuses, systems, and methods that allow technicians to perform additional diagnostic testing using these existing electrical test devices.

BRIEF SUMMARY

Shortcomings of the prior art are overcome and additional advantages are provided through the provision of an electrical diagnostic method that includes obtaining (i) an electrical test device configured to energize an electrical component, via a conductive probe element, and perform one or more electric measurements thereon, the test device comprising a housing, (ii) a diagnostic probe having a first end and a second end opposite the first end and being configured to perform an electrical analysis on the electrical component and provide an output of the electrical analysis, and (iii) a conductive probe element configured to be energized by the electrical test device and placed in contact with the electrical component thereby energizing the electrical component when energized by the electrical test device. Further, the first end of the diagnostic probe is coupled to the housing of the electrical test device, and the conductive probe element is coupled to the second end of the diagnostic probe. The method also includes, performing the electrical analysis on the electrical component to obtain the output via the diagnostic probe.

Also disclosed herein is a kit for use in performing electrical diagnostics, where the kit includes an electrical test device coupled to a power source and configured to energize, via a conductive probe element, an electrical component and configured to perform one or more electric measurements thereon, and where the test device includes a housing. Additionally, the kit includes a diagnostic probe having a first end and a second end opposite the first end, where the diagnostic probe is configured to perform an electrical analysis on the electrical component and provide an output of the electrical analysis. Further, the kit includes a conductive probe element configured to be energized by the electrical test device and configured to be placed in contact with the electrical component to energize the electrical component when energized by the electrical test device.

Also disclosed herein is a system for performing electrical diagnostics, where the system includes an electrical test device coupled to a power source and configured to energize, via a conductive probe element, an electrical component and configured to perform one or more electric measurements thereon, the test device comprising a housing. Further, the system includes a diagnostic probe having a first end and a second end opposite the first end and being configured to perform an electrical analysis on the electrical component and provide an output of the electrical analysis. The system also includes a conductive probe element configured to be energized by the electrical test device and configured to be placed in contact with the electrical component to energize the electrical component when energized by the electrical test device.

Also disclosed herein is a diagnostic probe apparatus, where the apparatus includes a first end and a second end opposite the first end, the first end being configured to couple to a housing of an electrical test device, and the second end being configured to couple to a conductive probe element configured to be energized by the electrical test device. Additionally, the apparatus includes one or more selectable input mechanisms for modifying one or more settings of the diagnostic probe apparatus, and an electronic visual display for displaying an output of an electrical analysis performed via the diagnostic probe apparatus, wherein the electrical analysis is performed on an electrical path of an electrical component.

Additional features and advantages are realized through the concepts described herein.

BRIEF DESCRIPTION OF THE DRAWINGS

One or more aspects are particularly pointed out and distinctly claimed as examples in the claims at the conclusion of the specification. The foregoing as well as objects, features, and advantages of one or more aspects are apparent from the following detailed description taken in conjunction with the accompanying drawings in which:

FIG. 1 depicts a block diagram of an example electrical diagnostic method, according to an implementation of the present disclosure;

FIG. 3E illustrates a second side view of an example diagnostic probe apparatus, according to an implementation of the present disclosure;

FIG. 3F illustrates a first bottom perspective view of an example diagnostic probe apparatus, according to an implementation of the present disclosure;

FIG. 3G illustrates a second bottom perspective view of an example diagnostic probe apparatus, according to an implementation of the present disclosure;

FIG. 3H illustrates a second elevated perspective view of an example diagnostic probe apparatus, according to an implementation of the present disclosure;

FIG. 3I illustrates a bottom view of an example diagnostic probe apparatus, according to an implementation of the present disclosure;

FIG. 3J illustrates a top view of an example diagnostic probe apparatus, according to an implementation of the present disclosure;

DETAILED DESCRIPTION

Figure 2A:
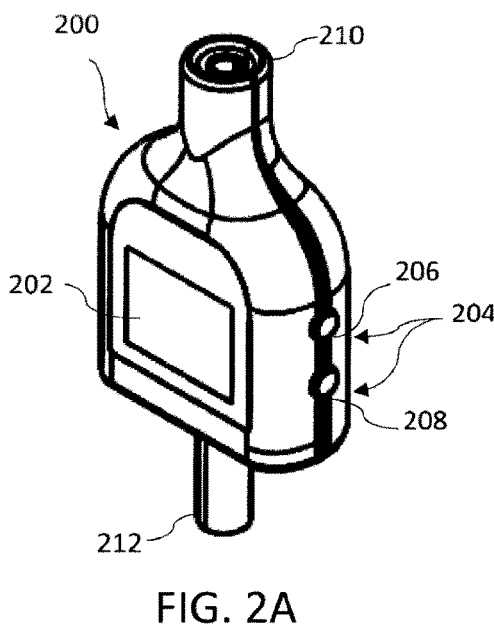
FIG. 2A illustrates an first elevated perspective view of an example diagnostic probe apparatus, according to an implementation of the present disclosure.
Figure 2B:
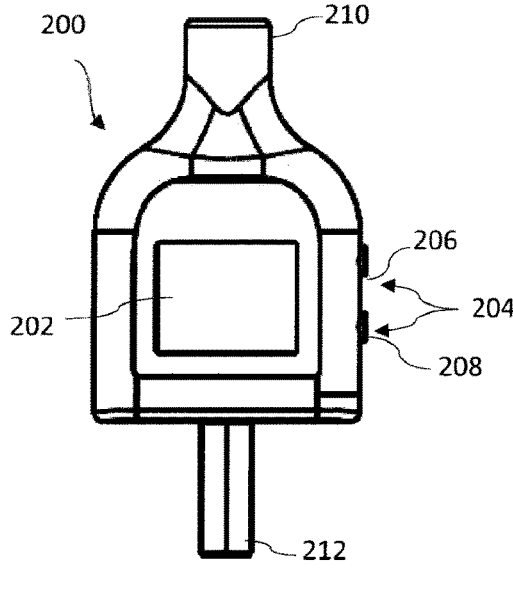
FIG. 2B illustrates a front view of an example diagnostic probe apparatus, according to an implementation of the present disclosure.
Figure 2C:
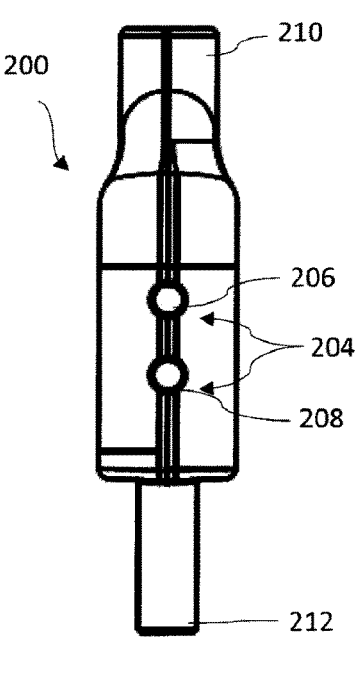
FIG. 2C illustrates a first side view of an example diagnostic probe apparatus, according to an implementation of the present disclosure.
Figure 2D:
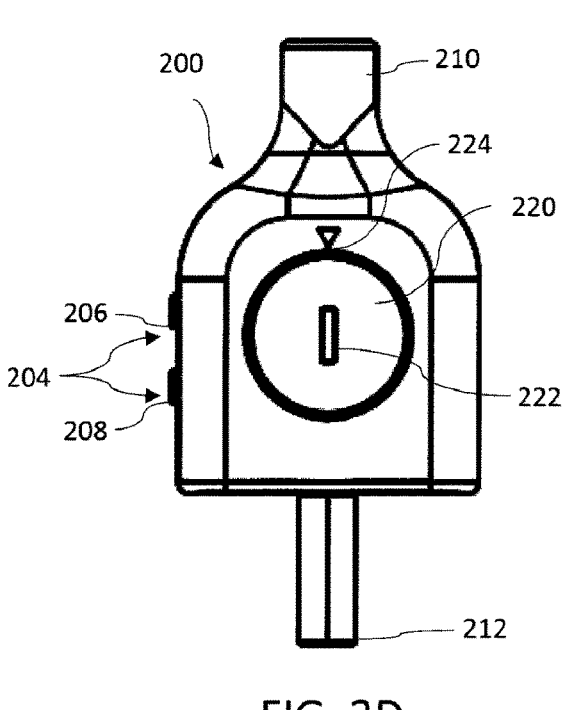
FIG. 2D illustrates a back view of an example diagnostic probe apparatus, according to an implementation of the present disclosure.
Figures 2E, 2F, 2G:
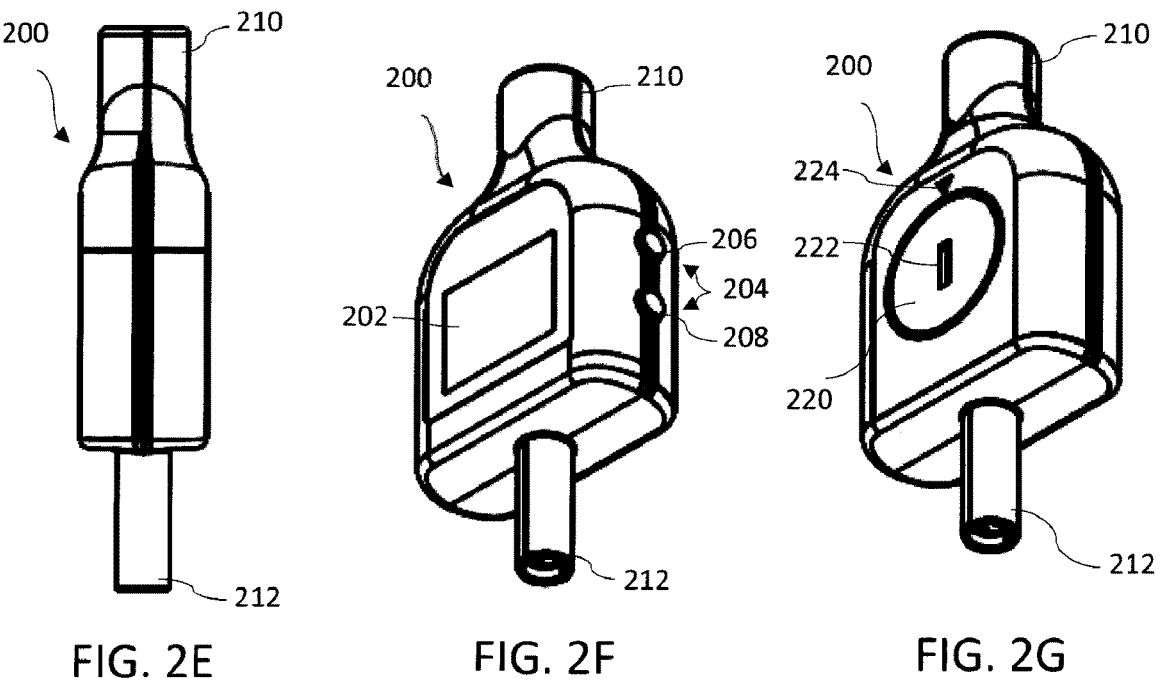
FIG. 2E illustrates a second side view of an example diagnostic probe apparatus, according to an implementation of the present disclosure.
FIG. 2F illustrates a first bottom perspective view of an example diagnostic probe apparatus, according to an implementation of the present disclosure.
FIG. 2G illustrates a second bottom perspective view of an example diagnostic probe apparatus, according to an implementation of the present disclosure.
Figure 2H:
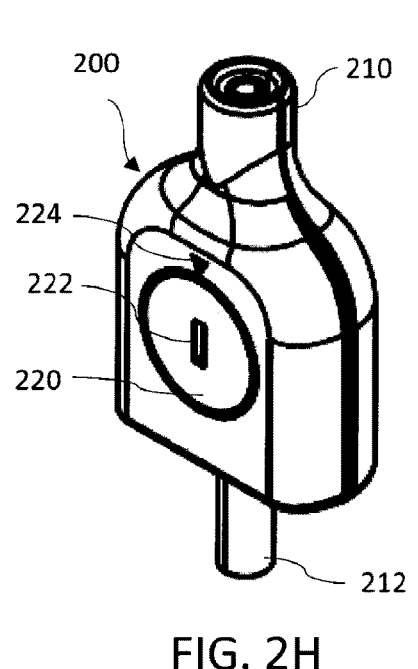
FIG. 2H illustrates a second elevated perspective view of an example diagnostic probe apparatus, according to an implementation of the present disclosure.
Figure 2I:
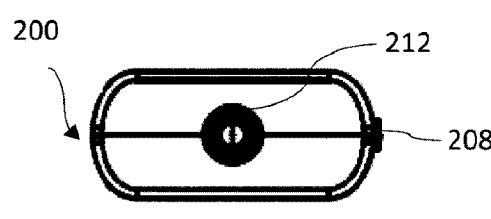
FIG. 2I illustrates a bottom view of an example diagnostic probe apparatus, according to an implementation of the present disclosure.
Figure 2J:
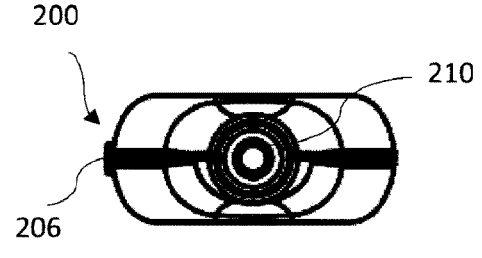
FIG. 2J illustrates a top view of an example diagnostic probe apparatus, according to an implementation of the present disclosure.
Figure 3A:
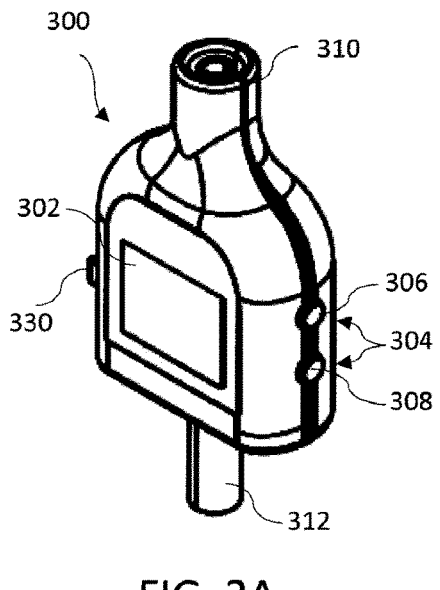
FIG. 3A illustrates a first elevated perspective view of an example diagnostic probe apparatus, according to an implementation of the present disclosure.
Figure 3B:
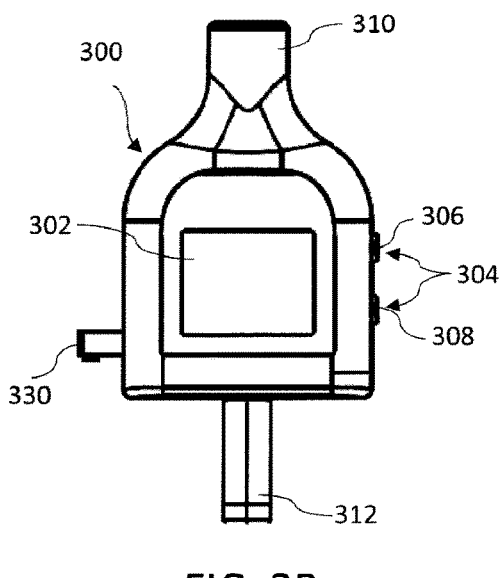
FIG. 3B illustrates a front view of an example diagnostic probe apparatus, according to an implementation of the present disclosure.
Figure 3C:
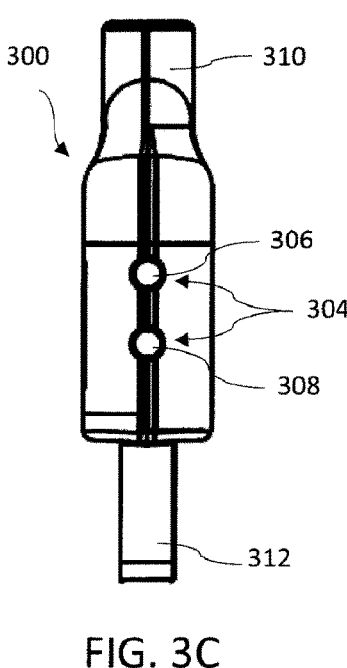
FIG. 3C illustrates a first side view of an example diagnostic probe apparatus, according to an implementation of the present disclosure.
Figure 3D:
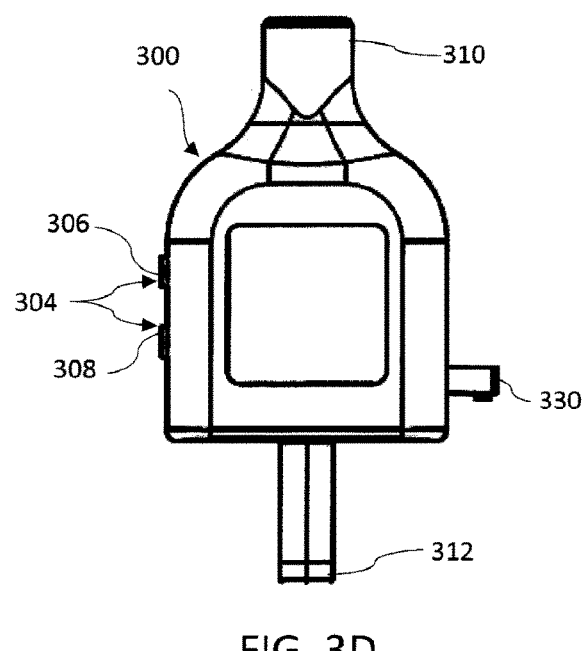
FIG. 3D illustrates a back view of an example diagnostic probe apparatus, according to an implementation of the present disclosure.

Aspects of the present invention and certain features, advantages, and details thereof are explained more fully below with reference to the non-limiting examples illustrated in the accompanying drawings. It is to be understood that the disclosed embodiments are merely illustrative of the present invention and the invention may take various forms. Further, the figures are not necessarily drawn to scale, as some features may be exaggerated to show details of particular components. Thus, specific structural and functional details illustrated herein are not to be interpreted as limiting, but merely as a representative basis for teaching one skilled in the art to employ the present invention.

Descriptions of well-known processing techniques, systems, components, etc. may be omitted to not unnecessarily obscure the invention in detail. It should be understood that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure. Additionally, numerous inventive aspects and features are disclosed herein, and unless inconsistent, each disclosed aspect or feature is combinable with any other disclosed aspect or feature as desired for a particular embodiment of the concepts disclosed herein.

The specification may include references to "one embodiment", "an embodiment", "various embodiments", "one or more embodiments", etc. may indicate that the embodiment(s) described may include a particular feature, structure or characteristic, but every embodiment may not necessarily include the particular feature, structure, or characteristic. In some cases, such phrases are not necessarily referencing the same embodiment. When a particular feature, structure, or characteristic is described in connection with an embodiment, such description can be combined with features, structures, or characteristics described in connection with other embodiments, regardless of whether such combinations are explicitly described.

The terms "couple", "coupled", "couples", "coupling", and the like should be broadly understood to refer to connecting two or more elements or signals electrically and/or mechanically, either directly or indirectly through intervening circuitry and/or elements. Two or more electrical elements may be electrically coupled, either direct or indirectly, but not be mechanically coupled; two or more mechanical elements may be mechanically coupled, either direct or indirectly, but not be electrically coupled; two or more electrical elements may be mechanically coupled, directly or indirectly, but not be electrically coupled. Coupling (whether only mechanical, only electrical, or both) may be for any length of time, e.g., permanent or semi-permanent or only for an instant. Additionally, "electrically coupled" and the like should be broadly understood and include coupling involving any electrical signal, whether a power signal, a data signal, and/or other types or combinations of electrical signals.

In addition, as used herein, the terms "about", "approximately", or "substantially" for any numerical values or ranges indicate a suitable dimensional tolerance that allows the device, part, or collection of components to function for its intended purpose as described herein. As used herein, the term "vehicle" is to be interpreted broadly to include any machine used to transport people or cargo including, for example, motor vehicles (e.g., motorcycles, cars, trucks, buses, mobility scooters, etc.), railed vehicles (e.g., trains, trams, etc.), watercraft (e.g., ships, boats, underwater vehicles, etc.), amphibious vehicles (e.g., hovercraft, screw-propelled vehicles, etc.), aircraft (e.g., airplanes, helicopters, etc.), and spacecraft.

The disclosed apparatuses, systems, kits, and methods may have elements in common and unless otherwise described herein, like numbering is used to refer to similar parts with similar functionality. Accordingly, description concerning certain aspects of the apparatuses, systems, kits, and methods may be omitted herein for purposes of conciseness. However, it is understood that those elements in common share substantially common configuration and/or functionality. For instance, figures having numbering 2XX may share substantially common configuration and/or functionality as figures having numbering 3XX, 4XX, 5XX, and 6XX. Additionally, components and/or aspects of the method of FIG. 1 apply to elements, configurations, and functionality of FIG. 2A-FIG. 6.

Disclosed herein is a diagnostic probe that may be used as an attachment with existing electrical test devices to perform electrical measurements that are currently not supported by the existing electrical test devices. For instance, some existing electrical test devices may be configured to only provide outputs related to voltage and continuity. Occasionally, technicians that use these devices may want to perform additional diagnostic measurements that would require the technician to invest in more technical and expensive electrical test devices. It may not always be advantageous for technicians to utilize these technical and expensive electrical test devices as the primary or flagship diagnostic tool as they can be more expensive to replace if they are misplaced or damaged during everyday use. Thus, technicians may currently have multiple electrical test devices on site with differing diagnostic capabilities, with many of these technical and more expensive electrical test devices taking up significant storage space in the toolbox.

Advantageously, the disclosed apparatuses, systems, and methods include a diagnostic probe attachment that can be coupled to the primary or flagship electrical test devices used by technicians that can perform the diagnostic processes offered by the more technical and expensive diagnostic probes. This diagnostic probe attachment would not need to be as bulky or consume as much space in the technician's toolbox because many of the components necessary to perform the additional diagnostic measurements would already be included in the existing electrical test devices. Thus, the disclosed apparatuses, systems, and methods for the diagnostic probe attachment could be relatively small (e.g., small enough to fit into a technician's pocket) and could be readily accessible by the technician if it is discovered that additional electrical measurements are needed.

FIG. 1 depicts a block diagram of an example electrical diagnostic method 101, according to an implementation of the present disclosure. At block 103, the diagnostic method includes obtaining (i) an electrical test device configured to energize an electrical component, via a conductive probe element, and perform one or more electric measurements thereon, the test device comprising a housing, (ii) a diagnostic probe having a first end and a second end opposite the first end and being configured to perform an electrical analysis on the electrical component and provide an output of the electrical analysis, and (iii) a conductive probe element configured to be energized by the electrical test device and placed in contact with the electrical component thereby energizing the electrical component when energized by the electrical test device.

The electrical test device may be configured to provide current sourcing or power to an electrical path and/or electrical system of the electrical component under testing conditions. According to one example, the electrical component may be electrically isolated from the electrical system of a vehicle. Additionally, in order to generate power via the electrical test device, a user may, for example, push a button on the electrical test device to generate power to electrical component. Further, the electrical test device may be configured to measure one or more parameters associated with the electrical path and/or electrical system. For instance, the one or more parameters may include voltage and continuity. In various embodiments, the electrical test device may be configured to measure the integrity of low-impedance or low-resistance electrical paths such as a battery cable extending between a battery and a starter of a motor vehicle. For example, the electrical test device may provide a relatively high-amperage current pulse to generate a voltage drop that can be accurately measured, and electrical resistance can be calculated therefrom to determine whether an electrical path and/or electrical system is functioning properly. In particular, the voltage measurement may include determining, using a processor, a voltage across the electrical system of the electrical component in response to applying the electrical signal to the electrical system.

According to one embodiment, the diagnostic probe may be configured to perform an electrical analysis that includes various electric measurements. For instance, according to one embodiment, the diagnostic probe may be configured to perform a pulse width modulation (PWM) signal measurement. In particular, the PWM signal measurement may be displayed via an electronic visual display for displaying an output of an electrical analysis. For instance, the electrical test device may generate a PWM signal and based on the conductive probe element being in contact with the electrical component the PWM signal can be measured via the diagnostic probe. In particular, the electronic visual display may display a square waveform (e.g., a non-sinusoidal waveform) that represents the percentage of the time that the PWM signal is being generated. According to one embodiment, the electronic visual display may display a numerical percentage of the percentage of time that the PWM signal is being generated.

According to another embodiment, the diagnostic probe may be configured to perform one or more current measurements. In particular, the one or more current measurements may include a measurement of a current consumption of the electrical component and the one or more current measurements may be displayed via an electronic visual display for displaying an output of an electrical analysis. According to various embodiments, the one or more current measurements that may be displayed may include a maximum current reading that is reached and a minimum current reading that is reached. For instance, the measurement process may include maximum values and minimum values that are used to obtain the overall measured current, where the maximum and/or minimum values may assist a user in ensuring that an appropriate (e.g., not too much) amount of current is being applied to the electrical system of the electrical component.

According to one embodiment, the conductive probe element may include a conductive (e.g., metallic) tip that is configured to be placed in contact with the electrical path and/or electrical system of the electrical component.

The first end of the diagnostic probe may be sized and shaped or configured, for example, to be inserted into a receiving aperture positioned at an end of the housing of the electrical test device. According to one embodiment, the first end may be configured having a width of 4 mm (e.g., a banana plug), where the diagnostic probe itself may have a length extending from the first end to the second end of approximately 89 mm. Further, the diagnostic probe may have a first width (absent the protruding terminal) of approximately 45 mm that comprises a front side (e.g., where the electronic visual display is positioned) and a back side. Additionally, the diagnostic probe may have a second width of approximately 20 mm. At block 105, the method 101 includes coupling the first end of the diagnostic probe to the housing of the electrical test device, and at block 107 the method includes coupling the conductive probe element to the second end of the diagnostic probe. At block 109, the method 101 includes performing the electrical analysis on the electrical component to obtain the output via the diagnostic probe.

According to various embodiments, the method 101 may also include placing the conductive probe element in contact with an electrical system of the electrical component. Further, power may be provided to the conductive probe element, and an electrical signal may be applied to the electrical system of the electrical component.

According to various embodiments, performing the one or more electrical measurements on the electrical component includes generating, via the diagnostic probe, the output in response to placing the conductive probe element in contact with an electrical system of the electrical component and providing power thereto. Additionally, the generated output may be displayed via an electronic visual display of the diagnostic probe.

Further, based on the diagnostic probe being configured to perform electrical analysis that includes a PWM measurement, the generated output may include a PWM signal and the method 101 may include simultaneously selecting, based on the diagnostic probe being in a PWM mode to perform the electrical analysis comprising the PWM signal measurement and based on the diagnostic probe comprising at least two selectable input mechanisms for modifying one or more settings of the diagnostic probe, multiple selectable input mechanisms of the at least two selectable input mechanisms to toggle from the PWM mode to a voltage mode to detect power supply voltage. Additionally, the method 101 may include simultaneously selecting, based on the diagnostic probe being in the voltage mode, the multiple selectable input mechanisms to toggle from the voltage mode to the PWM mode. Additionally, according to one embodiment, the electrical component may include a rotatable fan having an adjustable rotational speed, and the method 101 further includes increasing a pulse width of the PWM signal measurement based on selecting a first selectable input mechanism of the at least two selectable input mechanisms, the pulse width of the PWM signal measurement being increased based on increasing, in response to selecting the first selectable input mechanism, the adjustable rotational speed of the rotatable fan. Further, according to one embodiment, the method 101 includes decreasing the pulse width of the PWM signal measurement based on selecting a second selectable input mechanism of the at least two selectable input mechanisms, the pulse width of the PWM signal measurement being decreased based on decreasing, in response to selecting the second selectable input mechanism, the adjustable rotational speed of the rotatable fan.

According to one embodiment, the method 101 further includes selecting a first selectable input mechanism of the one or more selectable input mechanisms thereby activating the diagnostic probe. For instance, selecting the first selectable input mechanism for a relatively short period of time may turn on the diagnostic probe, and pressing or holding the first selectable input mechanism for a relatively longer period of time (e.g., more than two seconds) may turn off or deactivate the diagnostic probe. Additionally, the method 101 may also include selecting a second selectable input mechanism of the one or more selectable input mechanisms thereby clearing any existing values from prior electrical analysis. For instance, pressing the second selectable input mechanism for a relatively short period of time may clear the existing value(s) (e.g., a maximum current reading, a minimum current reading, and/or overall current consumption of the electrical component) that are displayed on the electronic visual display. According to one embodiment, the maximum and minimum values will be cleared by pressing the second selectable input mechanism, and based on clearing the maximum and minimum values the overall current measurement may be displayed. Further, according to one embodiment, the diagnostic probe may include a backlight, and the method 101 may further include selecting the second selectable input mechanism for a first extended period of time (e.g., more than two seconds) thereby activating the backlight. Additionally, the method 101 may include selecting, while the backlight is activated, the second selectable input mechanism for a second extended period of time (e.g., more than two seconds) thereby deactivating the backlight.

According to one embodiment, based on the electrical analysis including one or more current measurements, the generated output may include a current consumption of the electrical component.

FIGS. 2A-2J illustrate several views of an example diagnostic probe apparatus 200, according to one embodiment. As depicted, the diagnostic probe apparatus 200 may be configured as an adaptor that plugs into an electrical test device (not shown) via a first end 212 (e.g., a 4 mm banana plug). Additionally, the diagnostic probe apparatus 200 may include a second end 210 that is coupled to the diagnostic probe element (not shown). In particular, according to one embodiment of the diagnostic probe apparatus 200, using the diagnostic probe apparatus 200 may provide a measurement of DC current in order to identify, for example, a circuit failure in order to facilitate replacing or repairing an electrical component of a vehicle. For instance, whenever an electrical component is powered up via the electrical test device, the diagnostic probe apparatus 200 may be used to monitor the current to determine the health of the electrical component. According to one embodiment, the diagnostic probe apparatus 200 may be used to measure current as high as 20 amperes and as low as 1 milliampere. In diagnosing the electrical component, a user may determine, for example, from the electrical analysis whether the current exceeds 75% of the fuse amperage that protects that circuit.

According to one embodiment, an output of an electrical analysis may include one or more current measurements that are displayed via an electronic visual display 202. For instance, the electronic visual display 202 may display a maximum current reading that is reached and a minimum current reading that is reached. Further, the diagnostic probe apparatus 200 may include a first selectable input mechanism 206 of one or more selectable input mechanisms 204 that is used to activate the diagnostic probe apparatus 200. Additionally, the diagnostic probe apparatus 200 may also include a second selectable input mechanism 208 of one or more selectable input mechanisms 208, selection of which may clear any existing values from prior electrical analysis. In particular, the one or more selectable input mechanisms may be configured to modify one or more settings of the diagnostic probe apparatus 200.

Additionally, the diagnostic probe apparatus 200 may include an internal power source (not shown) such as a disk batter or the like, and the internal power source may be removably housed within the diagnostic probe apparatus 200 via a cap 220. For instance, the cap 220 may include a functional crevice 222 used to lock or unlock the cap 220 from the housing of the diagnostic probe apparatus 200. For instance, locking the cap 220 may include rotating the cap 220 such that the functional crevice 222 aligns with a marking 224, and unlocking the cap 220 may include rotating the cap 220 such that the functional crevice 222 is perpendicular to the location of the marking 224.

Additionally, the diagnostic probe apparatus 200 may be configured to automatically deactivate (i.e., power down) after a period of non-use (e.g., around approximately ten minutes of non-use).

FIGS. 3A-3J illustrate several views of an example diagnostic probe apparatus 300, according to one embodiment. The diagnostic probe apparatus may be configured as an adaptor that plugs into an electrical test device (not shown) via a first end 312 (e.g., a 4 mm banana plug). Additionally, the diagnostic probe apparatus 300 may include a second end 310 that is coupled to the diagnostic probe element (not shown). In particular, according to one embodiment of the diagnostic probe apparatus 300, using the diagnostic probe apparatus 300 may provide a measurement of a PWM signal. For instance, the electrical test device (not shown) may generate a PWM signal and based on the conductive probe element (not shown) being in contact with the electrical component (not shown) the PWM signal can be measured via the diagnostic probe apparatus 300.

Further, the diagnostic probe apparatus 300 may generate an output that is displayed via an electronic visual display 302. For instance, the electronic visual display 302 may display a square waveform (e.g., a non-sinusoidal waveform) that represents the percentage of the time that the PWM signal is being generated. According to one embodiment, the electronic visual display 302 may display a numerical percentage of the percentage of time that the PWM signal is being generated.

According to one embodiment, the diagnostic probe apparatus 300 may also include a first selectable input mechanism 306 of one or more selectable input mechanisms 304, selection of which may increase the pulse width percentage of the PWM signal. Additionally, the diagnostic probe apparatus 300 may also include a second selectable input mechanism 308 of one or more selectable input mechanisms 304, selection of which may decrease the pulse width percentage of the PWM signal. Based on adjusting the pulse width percentage in response to selection of the first selectable input mechanism 306 or second selectable input mechanism 308, a rotatable fan having an adjustable rotational speed that is included in the electrical component may respond with increasing or decreasing rotational speed. In particular, if the pulse width of the PWM signal measurement is increased based selecting the first selectable input mechanism, the adjustable rotational speed of the rotatable fan increases. Similarly, selection of the second selectable input mechanism 308 may decrease the pulse width of the PWM signal measurement, which may result in decreasing the adjustable rotational speed of the rotatable fan. According to one embodiment, the PWM signal measurement can have an adjustable pulse width (e.g., duty cycle) between 5%-100%. Additionally, the embodiment of the diagnostic probe apparatus 300 that provides the PWM signal may have a maximum continuous output of approximately 10 amperes.

Additionally, according to one embodiment, simultaneously selecting multiple selectable input mechanisms (e.g., the first selectable input mechanism 306 and the second selectable input mechanism 308), based on the diagnostic probe apparatus 300 being in a PWM mode to perform the electrical analysis that includes the PWM signal measurement, may initiate toggling from the PWM mode to a voltage mode to detect power supply voltage. For instance, if the diagnostic probe apparatus 300 is currently in a PWM mode and the user wants to toggle to the voltage mode, the user may simultaneously select both the first selectable input mechanism 306 and the second selectable input mechanism 308 to switch to voltage mode. Similarly, if the diagnostic probe apparatus 300 is currently in voltage mode, the user may simultaneously select both the first selectable input mechanism 306 and the second selectable input mechanism 308 to switch to PWM mode. Additionally, according to one embodiment, the pulse width would not be adjustable when the diagnostic probe apparatus 300 is in voltage mode. Further, the electronic visual display 302 may be configured to display the power supply voltage.

Additionally, the diagnostic probe apparatus 300 may include a housing and a grounding terminal 330 coupled thereto. The grounding terminal 330 may be accessed by the user to connect a ground lead of the electrical test device to the grounding terminal 330 to complete the circuit. In particular, once the ground lead of the electrical test device is attached to the grounding terminal 330, the user may activate the electrical test device to activate the diagnostic probe apparatus 300.

Figure 4:
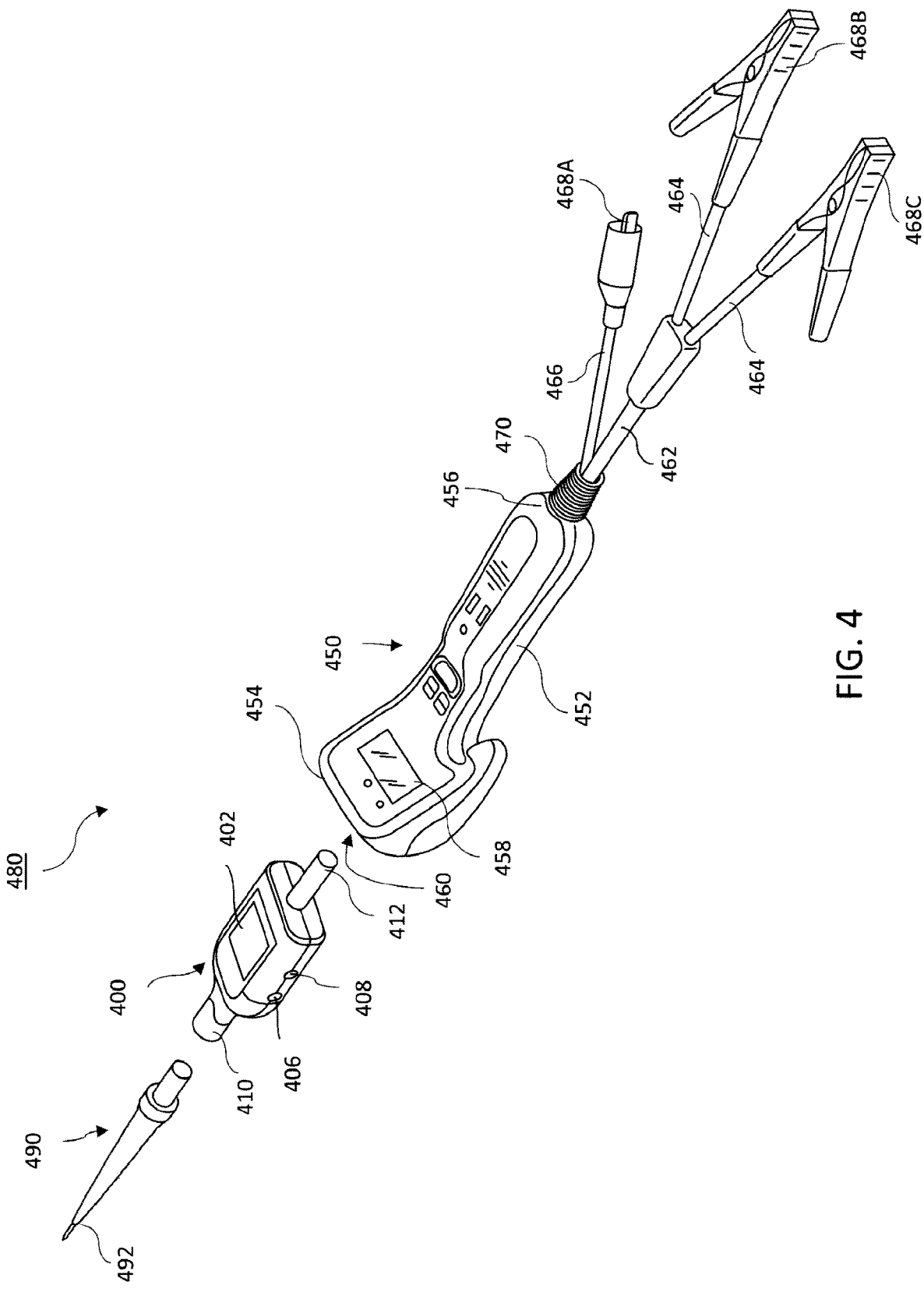
FIG. 4 depicts an example kit for use in performing electrical diagnostics, according to an implementation of the present disclosure.

FIG. 4 depicts an example kit 480 for use in performing electrical diagnostics, according to an implementation of the present disclosure. The kit 480 may include a diagnostic probe apparatus 400 having a first end 412 and a second end 410, an electronic visual display 402, as well as a first selectable input mechanism 406 and a second selectable input mechanism 408. Further, the kit 480 may include an electrical test device 450 that can be coupled to the first end 412 of the diagnostic probe apparatus 400. In particular a probe jack 460 located at a first end 454 of the electrical test device 450 may be configured to receive the first end 412 of the diagnostic probe apparatus. Further, the electrical test device 450 may include a display device 458 for displaying one or more measurements, in particular, according to various embodiments, the one or more measurements may include voltage and/or continuity measurements. Additionally, the electrical test device 450 may include a housing 452 that is used to house various components including, for example, a processor. Further, at a second end 456 of the diagnostic probe apparatus 400 a bushing 470 may connect a power cable 462 and a ground lead 466 to the housing 452. Further, the ground lead 466 may include an alligator clip 468A that is used to connect to a ground terminal. The power cable 462 may split into two power leads (i.e., a positive lead and a negative lead) each having a respective alligator clip 468B, 468C.

Additionally, the second end 410 may be configured to receive a conductive probe element 490 having a conductive (e.g., metallic) tip 492 that is configured to be placed in contact with an electrical component (not shown) to perform one or more electrical measurements and electrical analysis. In particular the one or more electrical measurements may include a voltage measurement and/or a continuity measurement. Further, the electrical analysis may include a PWM signal measurement or one or more current measurements.

According to one embodiment, the electrical test device 450 may be coupled to a power source (not shown) and configured to energize, via the conductive probe element 490, an electrical component (not shown) and configured to perform one or more electric measurements thereon. Additionally, the diagnostic probe apparatus 400 may have a first end 412 and a second end 410 opposite the first end and be configured to perform an electrical analysis on the electrical component (not shown) and provide an output of the electrical analysis (e.g., via the electronic visual display 402). The conductive probe element 490 may be configured to be energized by the electrical test device 450 and configured to be placed in contact, via the conductive tip 492, with the electrical component (not shown) to energize the electrical component (not shown) when energized by the electrical test device 450.

According to one embodiment, the electrical test device 450 may include an internal current-limiting trip switch that can provide protection to the diagnostic probe apparatus 400 when the load is too high.

Figures 5A, 5B:
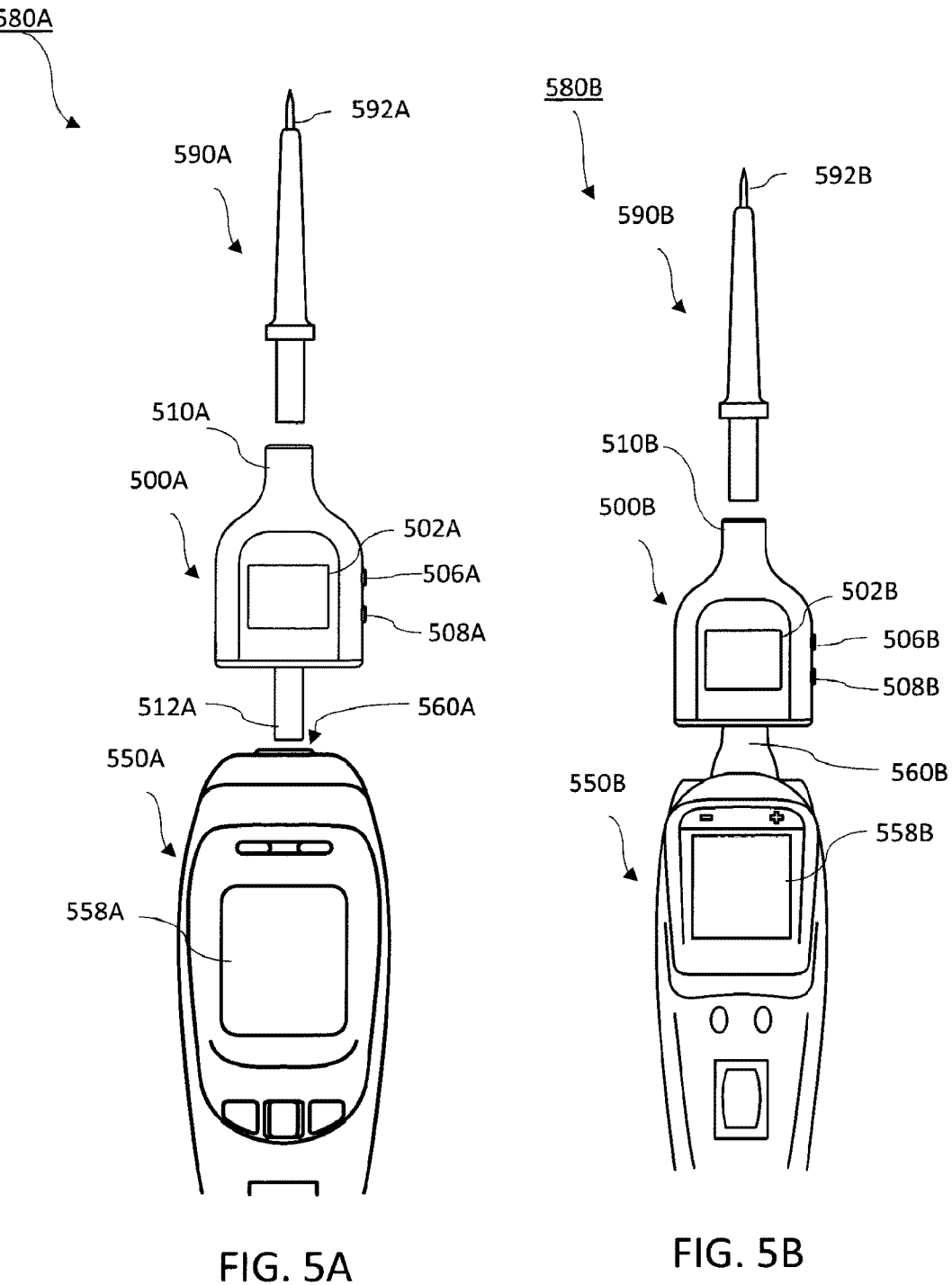
FIG. 5A depicts an example kit for use in performing electrical diagnostics, according to an implementation of the present disclosure.
FIG. 5B depicts an example kit for use in performing electrical diagnostics, according to an implementation of the present disclosure.

FIGS. 5A and 5B depict example kits 580A, 580B for use in performing electrical diagnostics, according to various implementation of the present disclosure. In particular, the kits 580A, 580B may each include a respective diagnostic probe apparatus 500A, 500B having a respective first end 512A, (not shown in FIG. 5B) and a respective second end 510A, 510B. In FIG. 5B, the first end is coupled to a probe jack 560B of an electrical test device 550B. Further, the respective diagnostic probe apparatus 500A, 500B may each include a respective electronic visual display 502A, 502B, as well as a first selectable input mechanism 506A, 506B and a second selectable input mechanism 508A, 508B. Each kit 580A, 580B may also include an electrical test device 550A, 550B each having a respective probe jack 560A, 560B for coupling to the first end 512A (not shown in FIG. 5B) of the diagnostic probe apparatus 500A, 500B. Further, each electrical test device 550A, 550B may include a respective display device 558 for displaying one or more measurements. The kits 580A, 580B may also include respective conductive probe elements 590A, 590B each having a respective conductive tip 592A, 592B configured to be placed in contact with an electrical component (not shown).

Figure 6:
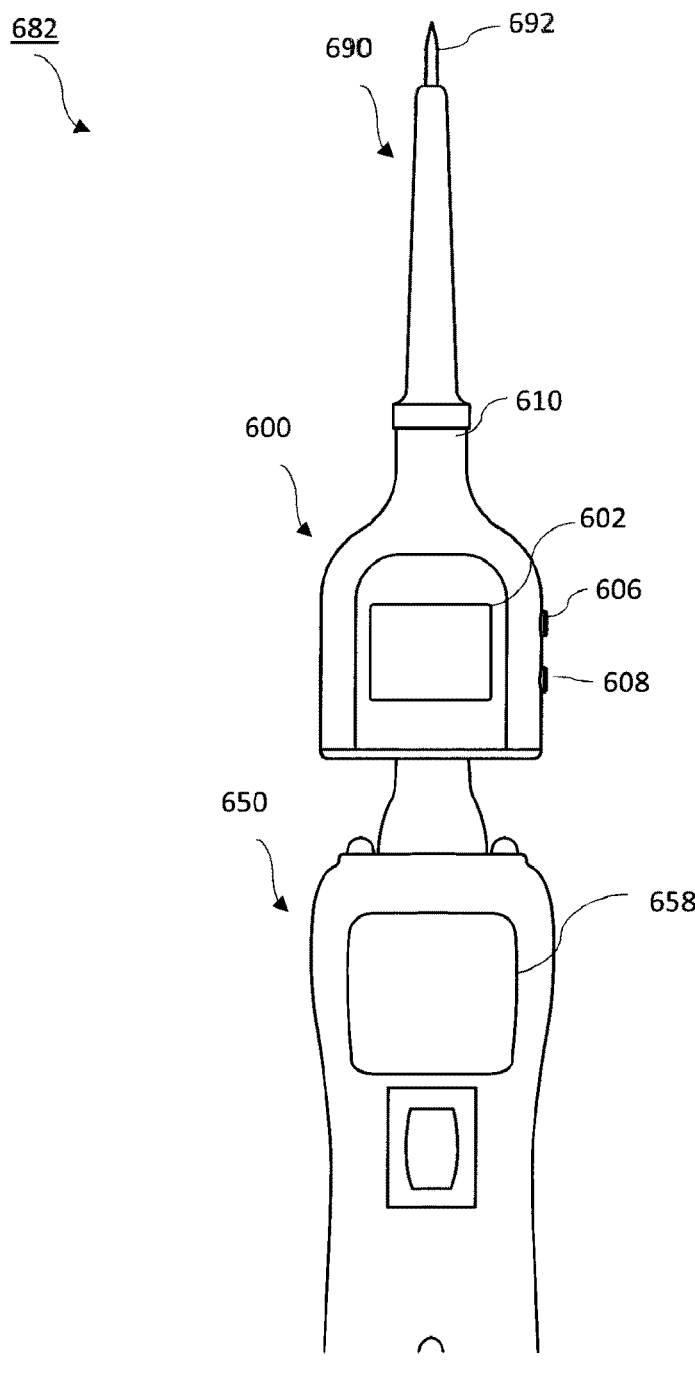
FIG. 6 depicts an example system for performing electrical diagnostics, according to an implementation of the present disclosure.

FIG. 6 depicts an example system 682 for performing electrical diagnostics, according to an implementation of the present disclosure. The system 682 includes an electrical test device 650 coupled to a power source (not shown) such as an external battery, and configured to energize, via a conductive probe element 690, an electrical component (not shown) and configured to perform one or more electric measurements thereon. Further, the test device 650 may include a housing within which various measurement components, such as a processor, are housed. Further, the system 682 includes a diagnostic probe 600 having a first end (not shown) and a second end 610 opposite the first end (not shown) that is configured to perform an electrical analysis on the electrical component (not shown) and provide an output of the electrical analysis (e.g., via an electronic visual display 602). The diagnostic probe 600 may also include one or more selectable input mechanisms 606, 608 (e.g., a first selectable input mechanism 606, and a second selectable input mechanism 608) for modifying one or more settings of the diagnostic probe 600. The test device 650 may also include a display device 658 that is used to display one or more measurements such as, for example, voltage and/or a continuity measurement.

Further, the system 682 may include a conductive probe element 690 configured to be energized by the electrical test device 650 (e.g., via the power source) and configured to be placed in contact (e.g., via the conductive tip 692) with the electrical component (not shown) to energize the electrical component (not shown) when energized by the electrical test device 650. Once the electrical component (not shown) is energized, the one or more electrical measurements performed thereon, via the electrical test device 650, may include a voltage measurement and a continuity measurement. Further, an electrical analysis may also be performed thereon, via the diagnostic probe 600, where the electrical analysis includes either a PWM signal measurement or one or more current measurements.

Additionally, according to one embodiment, a first diagnostic probe (a PWM adaptor such as diagnostic probe apparatus 300 described above) and a second diagnostic probe (a current adaptor such as diagnostic probe apparatus 200 described above) may be coupled one to another in between the conductive probe element and the electrical test device in order to test the current that the electrical component is drawing based on increasing or decreasing the pulse width. This particular functionality may be beneficial, for example, to test the current draw when the rotatable fan is rotating in response to applying a PWM signal.

Flowcharts and block diagrams depicted in the figures may illustrate functionality and operation of possible implementations of various apparatuses, systems, and methods, according to various embodiments of the present invention. In this regard, each block in the flowcharts and block diagrams may incorporate a specific function or portion of a function. Additionally, the flowcharts and block diagrams may incorporate alternative implementations and the functions noted in the block diagram may occur in a different order from that noted in the figures. For example, two blocks shown in succession may, in fact, be executed substantially concurrently, or the functions noted in the blocks may be implemented in reverse order depending on the functionality involved.

The terminology used herein is for describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An electrical diagnostic method, comprising:
obtaining (i) an electrical test device configured to energize an electrical component, via a conductive probe element, and perform one or more electric measurements thereon, the test device comprising a housing, (ii) a diagnostic probe having a first end and a second end opposite the first end and being configured to perform an electrical analysis on the electrical component and provide an output of the electrical analysis, and (iii) a conductive probe element configured to be energized by the electrical test device and placed in contact with the electrical component thereby energizing the electrical component when energized by the electrical test device;
coupling the first end of the diagnostic probe to the housing of the electrical test device;
coupling the conductive probe element to the second end of the diagnostic probe;
performing the electrical analysis on the electrical component to obtain the output via the diagnostic probe, wherein the electrical analysis comprises a pulse width modulation (PWM) signal measurement and the output comprises a PWM signal;
simultaneously selecting, based on the diagnostic probe being in a PWM mode to perform the electrical analysis comprising the PWM signal measurement and based on the diagnostic probe comprising at least two selectable input mechanisms for modifying one or more settings of the diagnostic probe, multiple selectable input mechanisms of the at least two selectable input mechanisms to toggle from the PWM mode to a voltage mode to detect power supply voltage; and
simultaneously selecting, based on the diagnostic probe being in the voltage mode, the multiple selectable input mechanisms to toggle from the voltage mode to the PWM mode.

2. The electrical diagnostic method of claim 1, wherein the performing the one or more electrical measurements on the electrical component comprises:
placing the conductive probe element in contact with an electrical system of the electrical component;
providing power to the conductive probe element; and
applying an electrical signal to the electrical system of the electrical component.

3. The electrical diagnostic method of claim 1, wherein the one or more electrical measurements comprise at least one of a voltage measurement and a continuity measurement.

4. The electrical diagnostic method of claim 1, wherein the one or more electrical measurements comprise at least one of a voltage measurement and wherein the voltage measurement comprises determining, using a processor, a voltage across the electrical system of the electrical component in response to applying the electrical signal to the electrical system.

5. The electrical diagnostic method of claim 1, wherein the performing the one or more electrical measurements on the electrical component comprises generating, via the diagnostic probe, the output in response to placing the conductive probe element in contact with an electrical system of the electrical component and providing power thereto.

6. The electrical diagnostic method of claim 1, wherein the output is displayed via an electronic visual display of the diagnostic probe.

7. The electrical diagnostic method of claim 1, wherein the electrical analysis comprises one or more current measurements and the output comprises current consumption of the electrical component.

8. The electrical diagnostic method of claim 1, wherein the diagnostic probe comprises an internal power source that is removably housed within the diagnostic probe via a cap.

9. The electrical diagnostic method of claim 1, wherein the diagnostic probe comprises one or more selectable input mechanisms for modifying one or more settings of the diagnostic probe.

10. The electrical diagnostic method of claim 1, wherein the method further includes:
selecting a first selectable input mechanism of one or more selectable input mechanisms thereby activating the diagnostic probe;
selecting a second selectable input mechanism of the one or more selectable input mechanisms thereby clearing any existing values from prior electrical analysis.

11. The electrical diagnostic method of claim 1, wherein the diagnostic probe comprises a backlight, and wherein the method further includes:
selecting a selectable input mechanism for a first extended period of time thereby activating the backlight; and
selecting, while the backlight is activated, the second selectable input mechanism for a second extended period of time thereby deactivating the backlight.

12. The electrical diagnostic method of claim 1, wherein the diagnostic probe comprises a housing and a grounding terminal coupled thereto.

13. An electrical diagnostic method, comprising:
obtaining (i) an electrical test device configured to energize an electrical component, via a conductive probe element, and perform one or more electric measurements thereon, the test device comprising a housing, (ii) a diagnostic probe having a first end and a second end opposite the first end and being configured to perform an electrical analysis on the electrical component and provide an output of the electrical analysis, and (iii) a conductive probe element configured to be energized by the electrical test device and placed in contact with the electrical component thereby energizing the electrical component when energized by the electrical test device;

coupling the first end of the diagnostic probe to the housing of the electrical test device;

coupling the conductive probe element to the second end of the diagnostic probe;

performing the electrical analysis on the electrical component to obtain the output via the diagnostic probe, wherein the electrical analysis comprises a PWM signal measurement and wherein the diagnostic probe comprises at least two selectable input mechanisms for modifying one or more settings of the diagnostic probe and the electrical component comprises a rotatable fan having an adjustable rotational speed;

increasing a pulse width of the PWM signal measurement based on selecting a first selectable input mechanism of the at least two selectable input mechanisms, the pulse width of the PWM signal measurement being increased based on increasing, in response to selecting the first selectable input mechanism, the adjustable rotational speed of the rotatable fan; and decreasing the pulse width of the PWM signal measurement based on selecting a second selectable input mechanism of the at least two selectable input mechanisms, the pulse width of the PWM signal measurement being decreased based on decreasing, in response to selecting the second selectable input mechanism, the adjustable rotational speed of the rotatable fan.

* * * * *